United States Patent

Neustadt

Patent Number: 5,999,403
Date of Patent: Dec. 7, 1999

[54] FRAME RACK WITH MODULE CARRIERS AND A VENTILATING INSTALLATION

[75] Inventor: Alf Neustadt, Stuttgart, Germany

[73] Assignee: Alcatel, Paris, France

[21] Appl. No.: 09/065,976

[22] Filed: Apr. 24, 1998

[30] Foreign Application Priority Data

May 9, 1997 [DE] Germany .............. 197 19 507

[51] Int. Cl.⁶ .................................................. H05K 7/20
[52] U.S. Cl. .................. 361/695; 361/797; 165/122; 454/184
[58] Field of Search .................... 415/60, 219.1, 415/220; 454/184; 165/80.3, 122–126; 312/236, 223.1; 174/15.1, 16.1; 361/690–695, 687, 831, 724–727, 796, 797, 802, 803

[56] References Cited

U.S. PATENT DOCUMENTS

| | | |
|---|---|---|
| 4,149,218 | 4/1979 | Carrobba . |
| 4,466,049 | 8/1984 | Chaney . |
| 4,767,262 | 8/1988 | Simon . |
| 5,168,171 | 12/1992 | Tracewell . |
| 5,210,680 | 5/1993 | Scheibler . |
| 5,528,454 | 6/1996 | Niklos . |
| 5,562,410 | 10/1996 | Sachs . |

FOREIGN PATENT DOCUMENTS

| | | |
|---|---|---|
| 0485281 | 6/1994 | European Pat. Off. . |
| 2710356 | 9/1977 | Germany . |
| 3038719 | 10/1981 | Germany . |
| 3408139 | 9/1985 | Germany . |
| 8714894 | 11/1987 | Germany . |
| 8914551 | 2/1990 | Germany . |
| 3933320 | 4/1991 | Germany . |
| 9103593 | 6/1991 | Germany . |
| 4309187 | 6/1994 | Germany . |
| 4422244 | 1/1996 | Germany . |
| 29622662 | 4/1997 | Germany . |

OTHER PUBLICATIONS

Mechanische Bauweisen fur die Elektronik, d. FA. KNURR–Mechanik fur die Electronik AG Munchen, 6, 1993.
"Handbuch 28", der Fa, Rittal–Werk Rudolf Loh GmbH & Co. KG, Herborn, 1994, pp. 383 and 384.

*Primary Examiner*—Gerald Tolin
*Attorney, Agent, or Firm*—Ware, Fressola, Van Der Sluys & Adolphson LLP

[57] ABSTRACT

In a cabinet (1) for telecommunications engineering, with a frame rack containing at least one module carrier (2) designed to receive plug-in units, and a ventilating installation for cooling the plug-in units, the ventilating installation comprises at least one fan insert (13) with several vertically blowing axial fans, which can be plugged in and integrated into the module carrier (2). The fan insert (13) is located under transverse supports of the module carrier (2) and has at least one plug connector at the rear, which makes contact with a secondary plug connector provided on the rear wiring panel (10).

9 Claims, 3 Drawing Sheets

5,999,403

FRAME RACK WITH MODULE CARRIERS AND A VENTILATING INSTALLATION

TECHNICAL FIELD

The invention concerns a frame rack with module carriers and ventilating installation for telecommunication housings or cabinets.

BACKGROUND OF THE INVENTION

A cabinet is known from EP-B-0 485 281, with a built-in swivel frame and mounting plates attached thereto, for carrying circuit boards that are vertically arranged on the rear side facing the inside of the cabinet, and which are separated from each other. If required to cool the heat produced by the circuit board components, there are air inlet ducts and fan inserts attached to the swivel frame under the mounting plates, each with two horizontally blowing axial fans. Deflectors are provided to guide the air streams vertically.

DE-A 27 10 356 also describes an aerated cabinet with a frame containing several cross bars, which allow the installation of two instrument housings next to each other in several superimposed rows. The instrument housings contain the groups of components to be cooled, and have slots in their bottom and top plates for the passage of cooling air. The latter is produced by two fan inserts placed in the frame rack between the lower row of instrument housings and the bottom of the cabinet. As viewed in the installation direction, each fan insert contains two vertically blowing axial fans placed next to each other.

Module carriers, for example in a 19" assembly system, are known from the publication DE-U-87 14 894; they can be equipped with different components and are mounted above each other in a frame, cabinet or housing. In an embodiment designed as a table housing, in addition to the side walls of the housing which is open on the front and has ventilation slots in the bottom and on the top, there are vertical profile rails to which the lateral flanges of the module carrier and the front plate of a fan insert are bolted, where the latter has an inserted filter mat instead of a bottom. Vertical profile rails attached horizontally to the guide rails facilitate the installation of the fan insert. Two vertically blowing axial fans are arranged next to each other behind the front plate of the fan insert, and the space behind them has connecting clamps for external lines that are connected to the axial fans' service lines.

When a defect has been signalled or the end of the service life of an axial fan, the replacement is complicated and time-consuming. In addition, this presupposes that the fan insert must be accessible from the rear of the housing for unclamping the external lines, before the attachment can be loosened from the vertical profile rails and the fan insert removed. Otherwise the external lines must have an excess length so that they can be pulled out of the housing together with the fan insert. This requires undesirable additional space for storing the excess lengths in the housing.

SUMMARY OF THE INVENTION

The object of the invention is to ensure an optimum cooling of the plug-in units in module carriers by means of a ventilating installation using axial fans, which allows the simple and rapid replacement of axial fans when required. The invention achieves this object with a frame rack for telecommunications engineering with at least one module carrier containing a rear wiring panel which has plug connectors for insertable plug-in units, and with at least one ventilating installation containing at least one vertically blowing axial fan for cooling the plug-in units, wherein the ventilating installation comprises a fan insert which can be plugged in and integrated into the module carrier, and with at least one plug connector at the rear which makes contact with a secondary plug connector on the rear wiring panel.

Among others, the advantages of this solution include that the replacement of the fan insert can be undertaken while the installation is operating, since neither connection cables nor attachment screws need to be removed. Since the replacement of the fan insert can be carried out with few hand movements, only a brief interruption of the cooling stream takes place which does not cause any unacceptable heating of the plug-in units being cooled. Other achievable advantages can be found in the description.

BRIEF DESCRIPTION OF THE DRAWINGS

The invention is explained in greater detail as follows by means of an embodiment illustrated by the drawings, wherein.

BEST MODE FOR CARRYING OUT THE INVENTION

Figure 1:
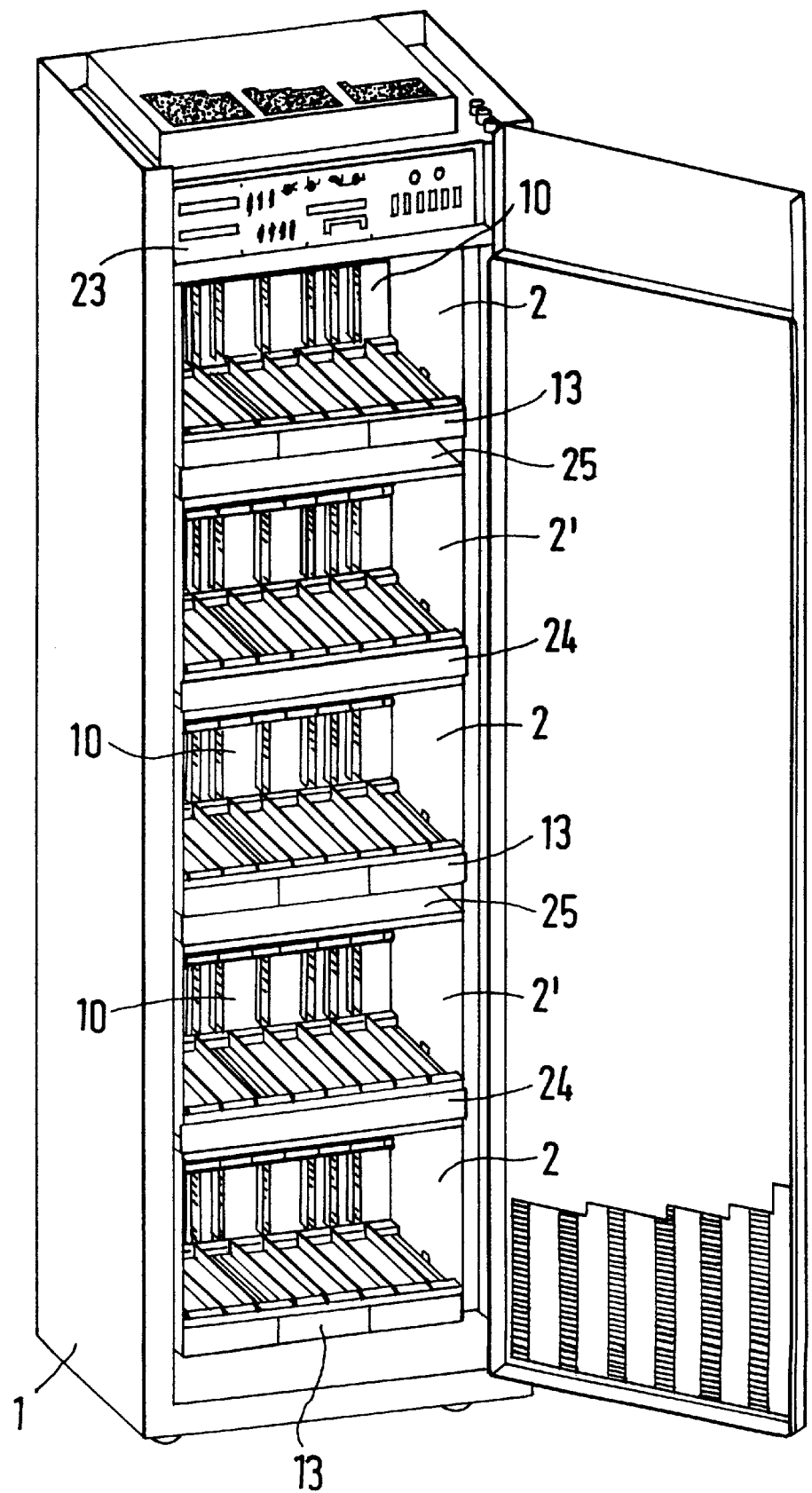
FIG. 1 is a perspective view of an open cabinet with five module carriers attached to a frame rack in the cabinet, before the plug-in units are installed.
Figure 2:
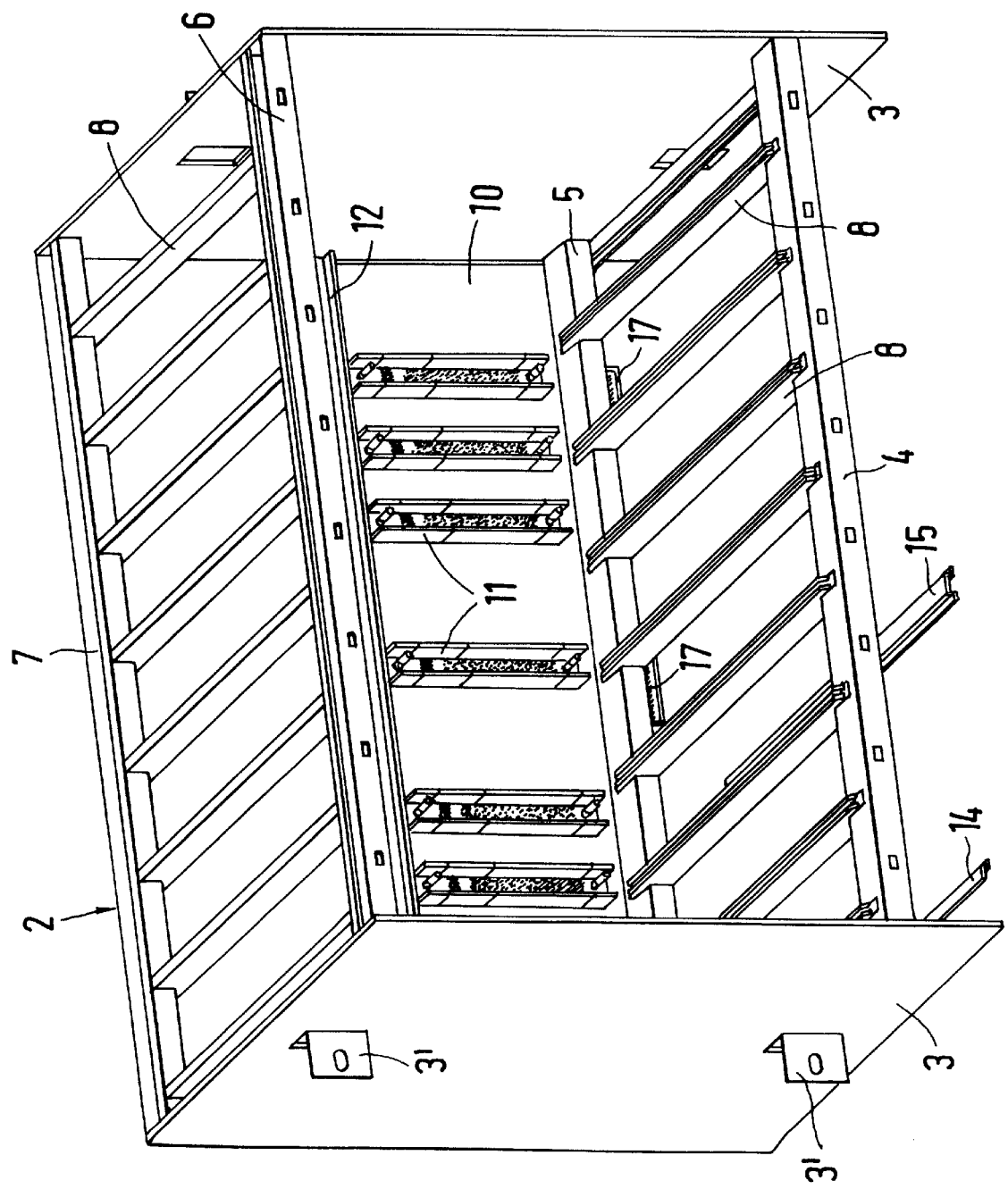
FIG. 2 is a perspective view of a module carrier in FIG. 1 before the installation of guide rails for fan inserts.
Figure 3:
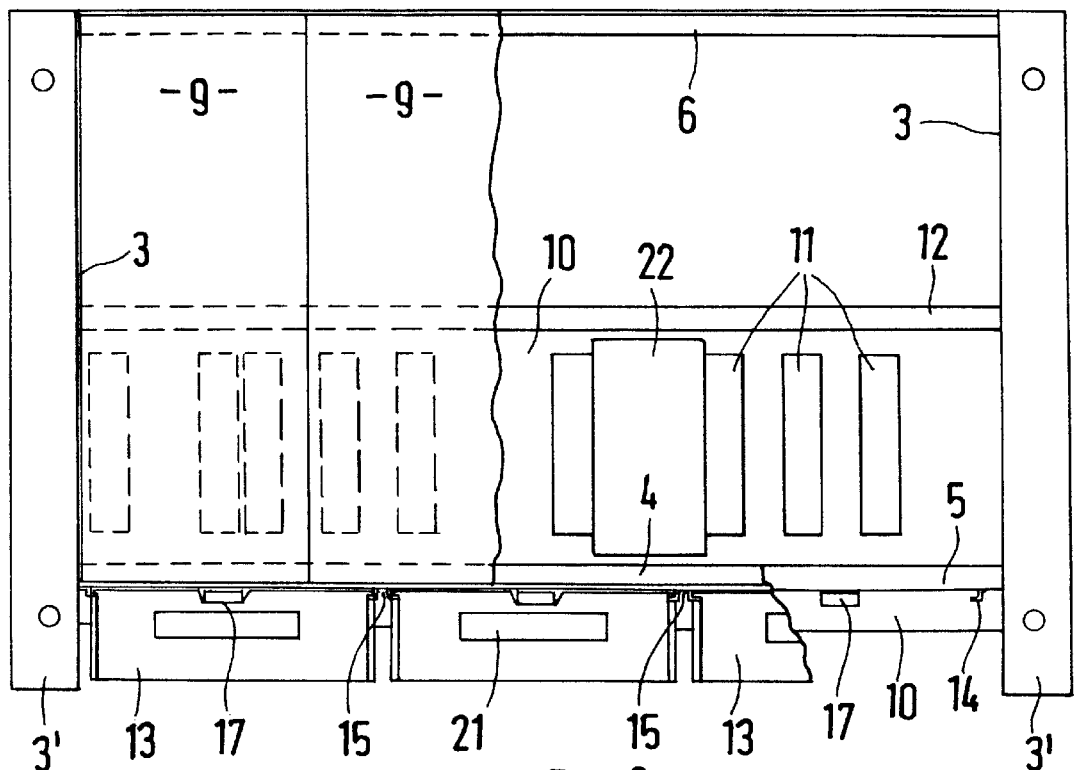
FIG. 3 is a partially cut front view of a module carrier equipped with plug-in units and fan inserts.

FIG. 1 designates the cabinet with its door by 1. This is a configuration with a frame rack whose vertical spars are made e.g. of separate L-shaped rails, or also of profile rails bent out of the cabinet sheet metal, to which for example five module carriers 2 are attached in a superimposed manner. As illustrated in FIGS. 2 and 3, such a module carrier 2 usually comprises two lateral walls 3 with attachment flanges 3' facing outward, and several transverse supports which connect the lateral walls. In the lower part these are a first front and a second rear transverse support 4, 5, as well as a third and fourth transverse support 6, 7 which interconnect the upper corners of the lateral walls 3 in the front and in the back. Both lower and upper transverse supports 4, 5 and 6, 7 have guide strips 8 attached at predetermined distances for plug-in units 9 (FIG. 3) which are at least partially equipped with cooling ribs, and make contact with plug connectors 11 installed on the front of the module carrier 2 located on a rear panel 10. The rear panel 10 is designed in the well known manner as a wiring panel, and is attached to the rear transverse supports.

Figure 4:
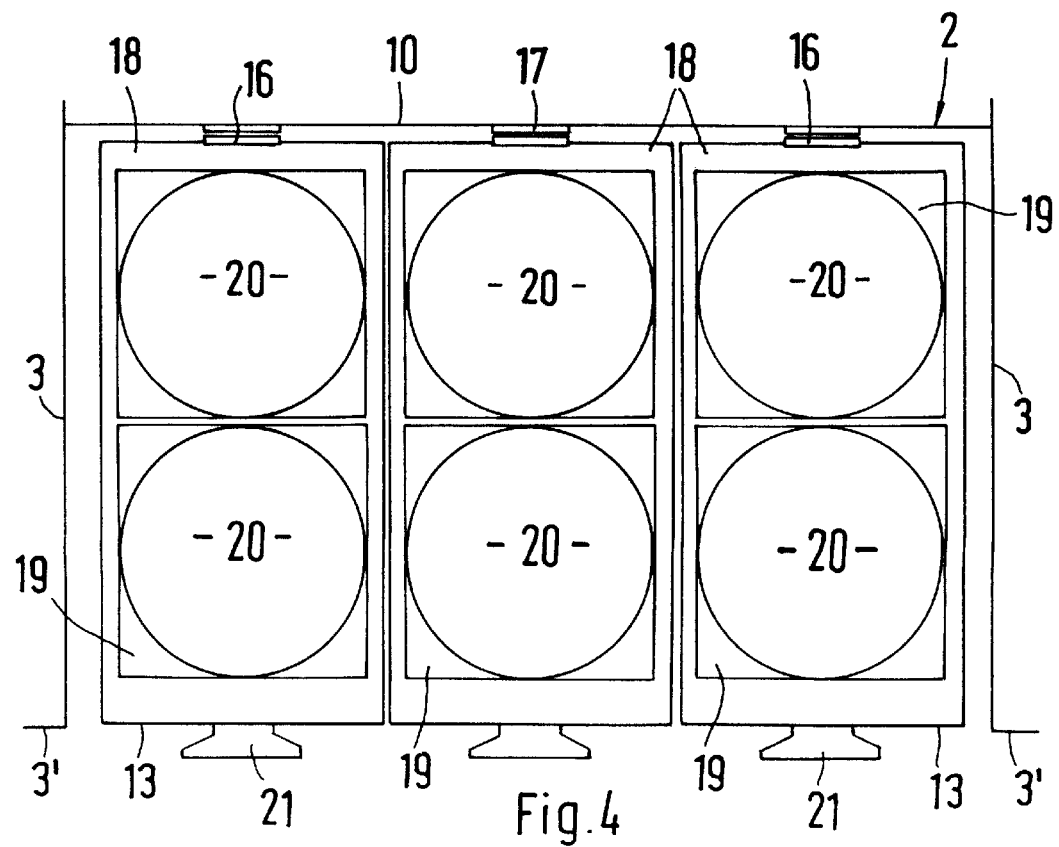
FIG. 4 is a top view of a schematically illustrated module carrier according to FIG. 3, cut horizontally above the fan inserts.

In the design of the module carrier 2 of the present configuration, the rear wiring panel 10 has a reduced height in order not to block the air circulation. For that reason a fifth transverse support 12, to which the upper end of the rear panel 10 is attached, is provided between the second and the fourth rear transverse supports 5, 7. In addition, in this case the lateral walls 3 are designed to be vertically longer and protrude from under both transverse supports 4, 5, which creates a laterally limited space for storing fan inserts 13 (FIGS. 3 and 4) which are built like drawers. Guide rails are attached to the underside of both lower transverse supports 4, 5 to hold the fan inserts 13. If only a single fan insert 13 is integrated in the module carrier 2 and occupies the entire width, only two guide rails 14 are needed, one of which is placed directly next to the lateral walls 3 in each instance. In this case the guide rails 14 have a Z-shaped cross section. Of course, guide rails 14 with L-shaped cross sections can also be provided, which are then attached to the inside of the lateral walls 3. If two half-wide fan inserts 13 are provided, an additional guide rail 15 which is built as a cap rail, is placed in the center of the lower transverse supports 4, 5.

To better adapt the cooling output to different requirements, the module carrier 2 preferably has three identically designed fan inserts 13 which are arranged next to each other in one plane. In that case two cap-shaped guide rails 15 are attached between the two Z-shaped guide rails 14 at a suitable distance from each other (FIG. 3). The guide rails 14, 15 are for example simple bent parts made of sheet metal, which can be cost-effectively produced and attached by spot-welding e.g. to the transverse supports 4, 5, which are also made of sheet metal. Since the fan insert 13 is designed as a plug-in unit which has a plug connector 16 at the rear, the lateral wall 10 of the module carrier 2 protrudes somewhat in the vertical direction under its lower transverse support 5, and carries the secondary plug connectors 17.

The drawer 18 of the fan insert 13 is a one-piece injection-molded plastic part. When viewed in the insertion direction it is designed as two sequential vents 19 with open tops, where each is able to receive a vertically blowing axial fan 20, and each vent 19 has at least one air inlet opening on the bottom. In addition, each of the two outer sides of the lateral walls of the drawer 18 has a slide strip for holding and guiding, where its flush closing top corresponds to the guide rails 14, 15 in the module carrier 2. To prevent any involuntary manual access into a module carrier 2 with activated plug-in units 9 and running axial fans 20, the vents 19 are covered with a plastic screen which is attached to the drawer 18 for safety. A convenient hand-grip 21 is formed on the front of the drawer 18, which also has at least one abutment suitably placed to lock the fan insert 13 in the module carrier 2. The locking can also be coupled to the hand-grip 21, so that an automatic interlock takes place when the fan insert 13 is installed, which can be unlocked by means of the hand-grip 21 (not illustrated).

The axial fans 20 are wired to the inside of the fan inserts 13 via their rear plug connectors 16. The axial fans 20 obtain their power through the plug connector 16. Control and monitoring lines are also connected there. The three auxiliary plug connectors 17, with their fronts suitably attached to the rear panel 10 of the module carrier 2, are in turn wired back among other things to a control module 22, which can preferably be plugged in between two plug connectors 11 for plug-in units 9. The rear panel wiring can comprise connecting wires, as well as conducting paths of the rear wiring panel 10, or a suitable combination of both types of electrical connections.

The pluggable arrangement of the control module 22 has the advantage that it can be replaced if necessary, after removing the plug-in unit 9 located before it. The control module 22 is equipped with a bus connection via which a control unit 23 can check the position of each axial fan 20 in every module carrier 2 of the frame rack. In this way defects can be detected, and the speed can be individually controlled in accordance with the cooling requirement, so that the front row of fans within a module carrier 2 e.g. can run at a different speed than that of the rear row of fans, or the axial fans 20 arranged on the bottom of the frame rack can rotate slower than those placed in the fan inserts of a module carrier 2 that is positioned at a higher level in the frame rack. Incidentally, the plug connectors 16 of the fan inserts 13 can be encoded by means of a wire or diode bridge, so that the coding contains e.g. the year the fan insert 13 was manufactured.

This information can also be read by the central control unit 23 via the bus connection of the control module 22, and the near end of the approximately 5.5 year service life of the axial fans can be signalled. The central control unit 23 is e.g. part of a mobile radio system and is stored in a base station cabinet 1.

Each of the vertical spars of the frame rack in such a base station has a row of holes at a predetermined spacing pattern for the attachment of the module carriers 2. As shown in FIG. 1, the height of the cabinet 1 is for instance 2 meters, which allows the full installation of five module carriers. Depending on the power loss produced by the plug-in units 9 and the position of the module carriers in the frame rack, module carriers 2 which are fully equipped with fan inserts 13 and module carriers 2' without fan inserts and without control module are arranged in the frame rack, but can be retrofitted without difficulty if required. The integrated arrangement of three adjacent fan inserts 13 in the module carriers 2, which can be plugged in or activated independently of each other, make it possible to lead incoming and outgoing HF cables vertically on the front of the plug-in units 9 and therefore via a short path between the different insertion planes, since only a minimal lateral displacement of the front cables is needed to replace the relatively small fan inserts 13.

In the illustrated embodiment of the base station, the cabinet 1 has a mixed installation as seen from the bottom to the top. The first lower module carrier 2, which is equipped with fan inserts 13, is followed by a second module carrier 2' without fan inserts, and the empty space is covered with a snap-in front shutter 24. A plate forms the bottom of an air intake compartment 25 located above this module carrier 2', and deflects rising warm air into a rear air exhaust duct in the cabinet 1. A third module carrier 2, which again is equipped with fan inserts 13, is located above the air intake compartment 25, and above that a fourth module carrier 2' covered by a front shutter 24, which is followed by a further air intake compartment 25 and a fifth module carrier 2 with fan inserts 13. Finally, the part of the cabinet 1 which is located above that contains among other things the central control unit 23 of the base station, and three further fan inserts 13 (top fans) with the same control electronics (control module 22). In this way a frame rack, in which five module carriers 2 that are fully equipped with fan inserts are mounted, can therefore contain thirty-six individually controllable axial fans 20.

What is claimed is:

1. A frame rack for telecommunications engineering with at least one module carrier (2, 2') containing a rear wiring panel (10) which has plug connectors (11) for insertable plug-in units (9), and with at least one ventilating installation containing at least one vertically blowing axial fan (20) for cooling the plug-in units (9), characterized in that the ventilating installation comprises at least one fan insert (13) that houses the at least one vertically blowing axial fan (20), each fan insert having at least one plug connector (16) at the rear which makes contact with a secondary plug connector (17) on the rear wiring panel (10) of the at least one module carrier, and further characterized in that a control module (22) for the individual control of said at least one vertically blowing axial fan (20) is located to the front of the rear wiring panel (10), and is electrically connected to the plug connectors (16, 17) for said at least one fan insert (13) and such that the control module is plugged in between two plug connectors (11) used to make contact with the plug-in units (9).

2. A frame rack for at least one module carrier as claimed in claim 1, characterized in that the module carrier (2, 2') is equipped with several guide rails (14, 15) that are attached to transverse supports (4, 5) on the bottom, for inserting the slide strips of the fan insert (13).

3. A frame rack with module carriers as claimed in claim 2, characterized in that the guide rails (14, 15) have an arrangement on the transverse supports (4, 5), and the plug connectors (17) for each fan insert (13) have an arrangement on the rear wiring panel (10), which makes it possible to plug in three fan inserts (13) next to each other.

4. A frame rack with module carriers as claimed in claim 3, characterized in that each fan insert (13) comprises a drawer (18) and two axial fans (20) which are wired to a rear plug connector (16) on the drawer (18).

5. A frame rack with module carriers as claimed in claim 4, characterized in that the drawer (18) is a one-piece injection-molded plastic part with two ventilators (19) placed behind each other in the plug-in direction, each able to receive a vertically blowing axial fan (20).

6. A frame rack with module carriers as claimed in claim 5, characterized in that the frame rack is equipped with several module carriers (2) and a central control unit (23), wherein each module carrier has an associated control module (22) that is connected electrically via bus connections to a central control unit (23) located in the frame rack.

7. A frame rack with module carriers as claimed in claim 1, characterized in that the guide rails (14, 15) have an arrangement on the transverse supports (4, 5), and the plug connectors (17) for each fan insert (13) have an arrangement on the rear wiring panel (10), which makes it possible to plug in three fan inserts (13) next to each other.

8. A frame rack with module carriers as claimed in claim 1, characterized in that each fan insert (13) comprises a drawer (18) and two axial fans (20) which are wired to a rear plug connector (16) on the drawer (18).

9. A frame rack with module carriers as claimed in claim 8, characterized in that the drawer (18) is a one-piece injection-molded plastic part with two ventilators (19) placed behind each other in the plug-in direction, each able to receive a vertically blowing axial fan (20).

* * * * *